United States Patent
Tseng

(10) Patent No.: US 6,316,331 B1
(45) Date of Patent: Nov. 13, 2001

(54) METHOD OF MAKING DISHING-FREE INSULATOR IN TRENCH ISOLATION

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/689,893

(22) Filed: Oct. 13, 2000

(51) Int. Cl.$^7$ .................................................. H01L 21/76
(52) U.S. Cl. ..................... 438/431; 438/430; 438/435; 438/437
(58) Field of Search .................................... 438/430, 431, 438/435, 437

(56) References Cited

U.S. PATENT DOCUMENTS

| | | |
|---|---|---|
| 4,471,525 * | 9/1984 | Sasaki . |
| 4,847,214 * | 7/1989 | Robb et al. . |
| 5,926,717 * | 7/1999 | Michael et al. ....................... 438/387 |
| 6,110,800 * | 8/2000 | Chou ..................................... 438/431 |
| 6,136,664 * | 10/2000 | Economikos et al. ............... 438/431 |

* cited by examiner

Primary Examiner—Trung Dang
(74) Attorney, Agent, or Firm—Bacon & Thomas, PLLC

(57) ABSTRACT

The present invention provides a method to form a dishing-free insulator in trench isolation without repeated formations of silicon sidewall spacers and thermal oxidation of the silicon sidewall spacers. Using Ion-Metal Plasma (IMP) process to deposit silicon film directionally in the trenchs of the substrate is the key point of the present invention.

5 Claims, 6 Drawing Sheets

METHOD OF MAKING DISHING-FREE INSULATOR IN TRENCH ISOLATION

FIELD OF THE INVENTION

The present invention relates to a method of making a trench isolation in a semiconductor substrate, and more particularly to a method of making dishing-free insulator in trench isolation.

BACKGROUND OF THE INVENTION

Conventional method to form STI (Shallow Trench Isolation) structure is shown in FIGS. 1A, 1B, and 1C. In FIG. 1A, a pad oxide layer 11 and a silicon nitride layer 12 are sequentially formed on a substrate 10. Next, a photoresist layer 14 with a trench pattern is formed on the silicon nitride layer 12 by a photolithography process. Then a trench 16 is formed by performing an anisotropic etching on the substrate 10 according to the trench pattern on the photoresist layer 14.

In FIG. 1B, after removing the photoresist layer 14, a thermal oxide layer 18 is formed on the trench surface by thermal oxidation at 20 a temperature of about 900° C.~1100° C. An oxide layer 20 is formed over the substrate 10 by atmospheric chemical vapor deposition (APCVD) with a reaction gas of tetra-ethyl-ortho-silicate (TEOS).

In FIG. 1C, a chemical mechanical polishing (CMP) process is performed to polish the TEOS oxide layer 20 above the silicon nitride 12. The remained TEOS oxide layer filled in the trench 16 is called an oxide plug 20a and is used for isolation. However, the CMP process will cause a dishing-type surface to be formed on the surface of the oxide plug 20a when the trench is wide, as shown in the figure.

In U.S. Pat. No. 6,110,800 Chou disclosed a method to form a shallow trench isolation (STI) structure. FIGS. 2A~2G show schematically the Chou's process in forming a STI structure by repeated formations of silicon sidewall spacers and thermal oxidation of the silicon sidewall spacers.

In FIG. 2A, a photoresist 202 is formed over a semiconductor substrate 200. A photolithography process is performed to transfer a pattern onto the substrate 200. Then an anisotropic etching is performed to form a trench 204 and a trench 206 on the substrate. The trench 204 is wider than the trench 206.

In FIG. 2B, an ion implantation is performed to form a channel stop 205 under the trench 204, 206, and then the photoresist layer 202 is removed. A pad oxide layer 208 and a silicon nitride 210 are sequentially formed over the substrate 200.

In FIG. 2C, a polysilicon layer is deposited over the substrate 200 through LPCVD and performing an etching back process to form a sidewall spacer 212b and a sidewall spacer 212a respectively on each side of the trench 204 and the trench 206 over the silicon nitride layer 210.

In FIG. 2D, an oxidation process is performed to oxidize the sidewall spacers 212a, 212b. Since the trench 206 is narrow, an oxide plug 214a is formed to fill the trench 206. The trench 204 is wide, an oxide sidewall aspacer 214b may be formed without filling the trench 204. In order to fully fill the trench 204 with oxide, another polysilicon sidewall spacer 216 is repeatedly formed and oxidized until an oxide plug 218 is formed to fully fill the trench 204 as shown in FIG. 2E.

In FIG. 2F, an oxide layer 220 is formed over the substrate 200 to have a better planar surface.

In FIG. 2G, an anisotropic etching process is performed to remove the oxide layer 220, the silicon nitride layer 210, and the pad oxide layer 208 outside the trenches 204, 206 to expose the substrate 200.

The Chou's method needs repeated formations of silicon sidewall spacers and thermal oxidation of the silicon sidewall spacers. Though this process can somewhat eliminate the dishing-effect in a wider trench, it is too complicated and costly.

OBJECT OF THE INVENTION

It is therefore an object of the present invention to provide a method to form a dishing-free insulator in trench isolation without repeated formations of silicon sidewall spacers and thermal oxidation of the silicon sidewall spacers.

DETAILED DESCRIPTION OF THE INVENTION

Figure 1A:
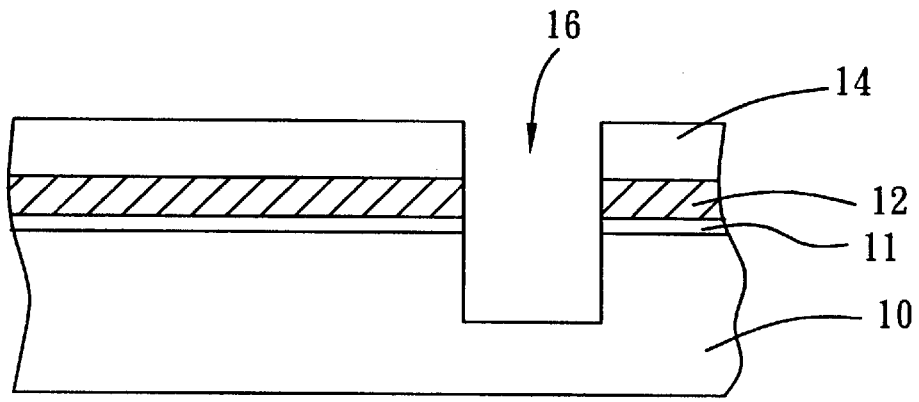
FIGS. 1A~1C show schematically the conventional process in forming a STI structure.
Figure 1B:
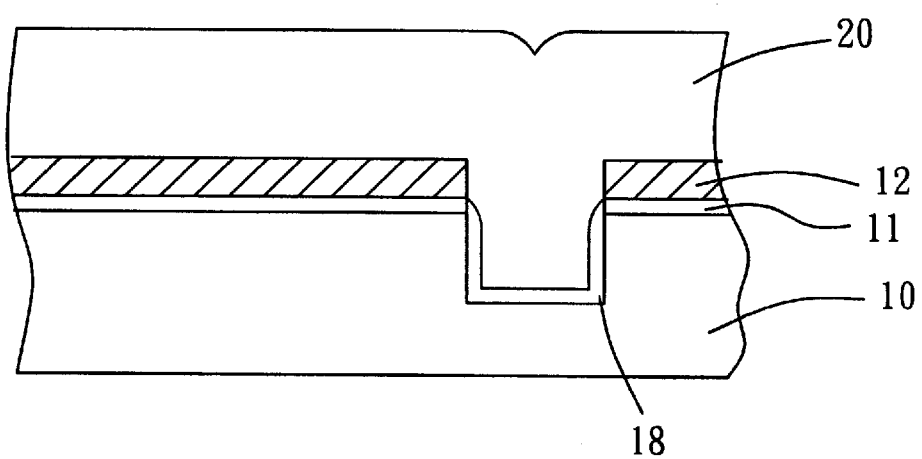
Figure 1C:
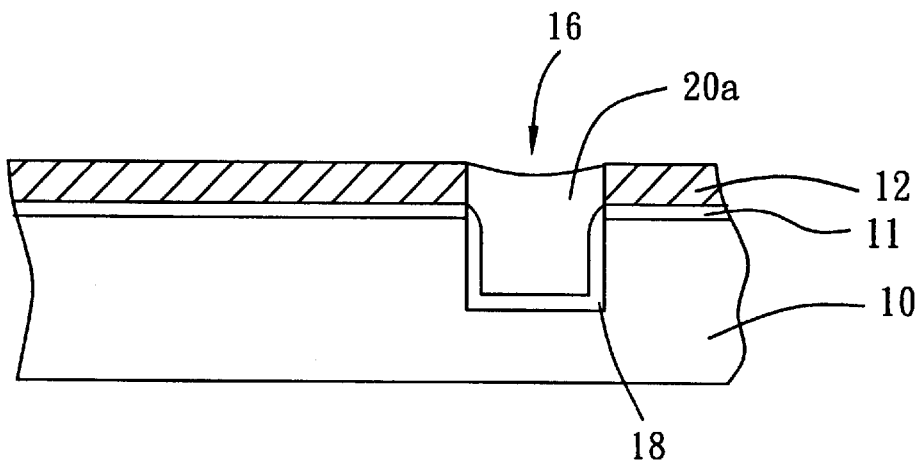
Figure 2A:
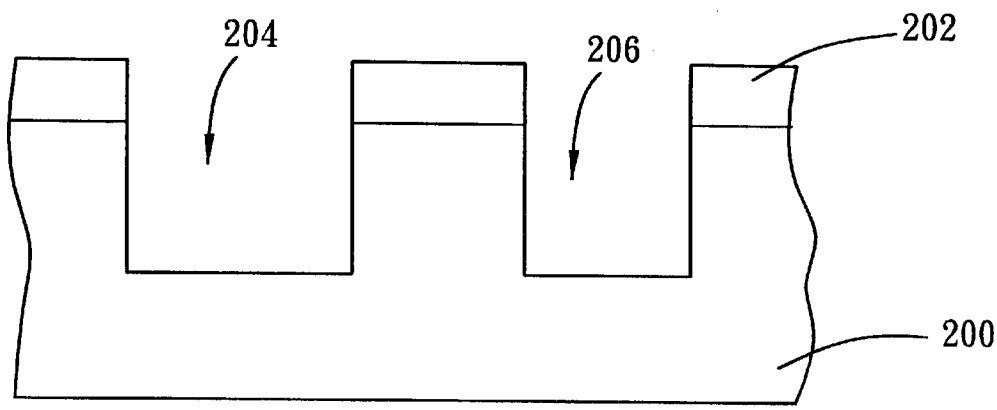
FIGS. 2A~2G show schematically the conventional process in forming a STI structure by repeated formations of sidewall spacers.
Figure 2B:
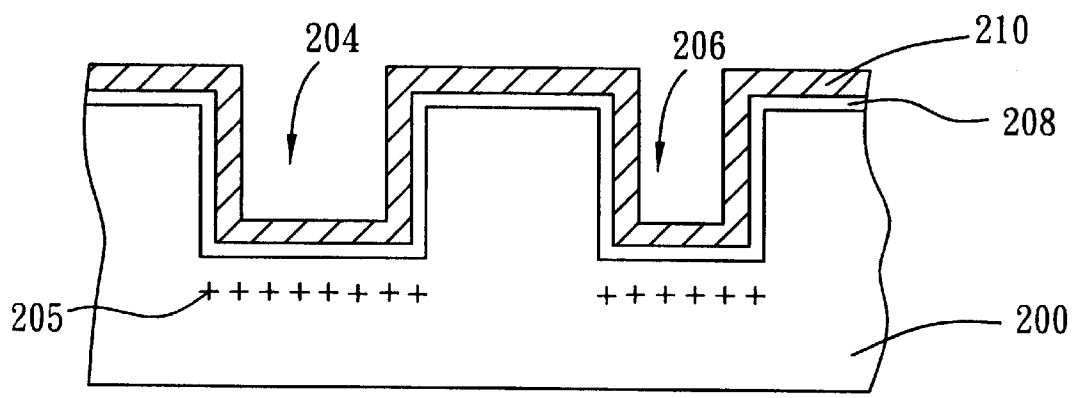
Figure 2C:
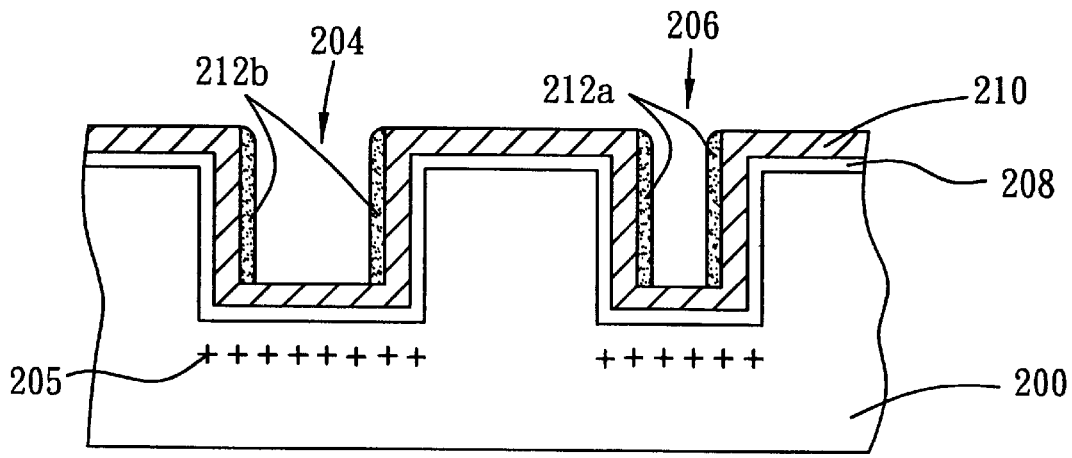
Figure 2D:
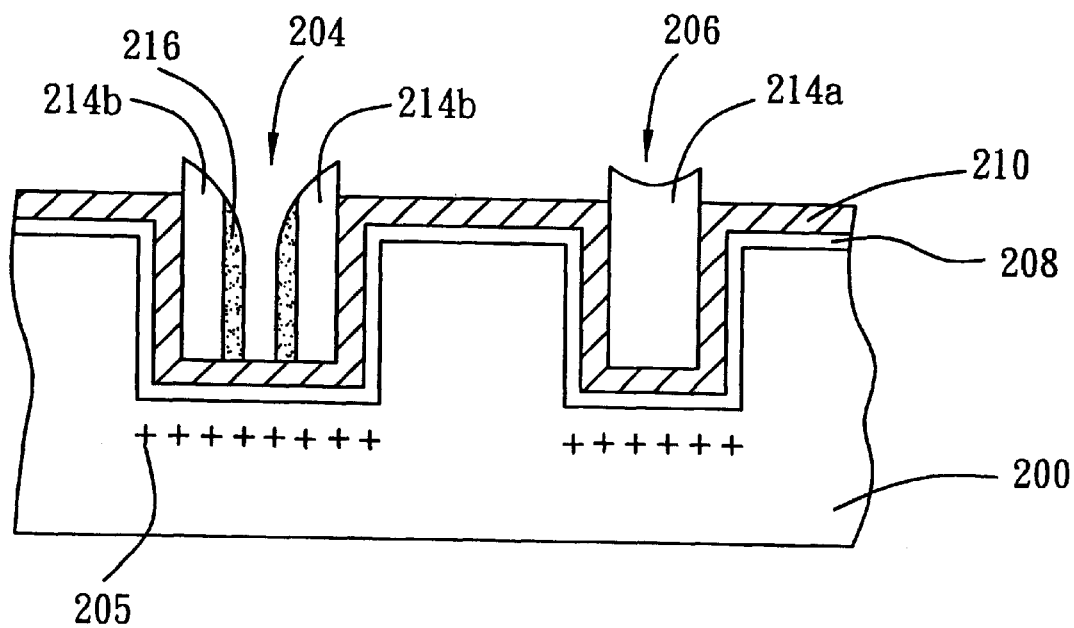
Figure 2E:
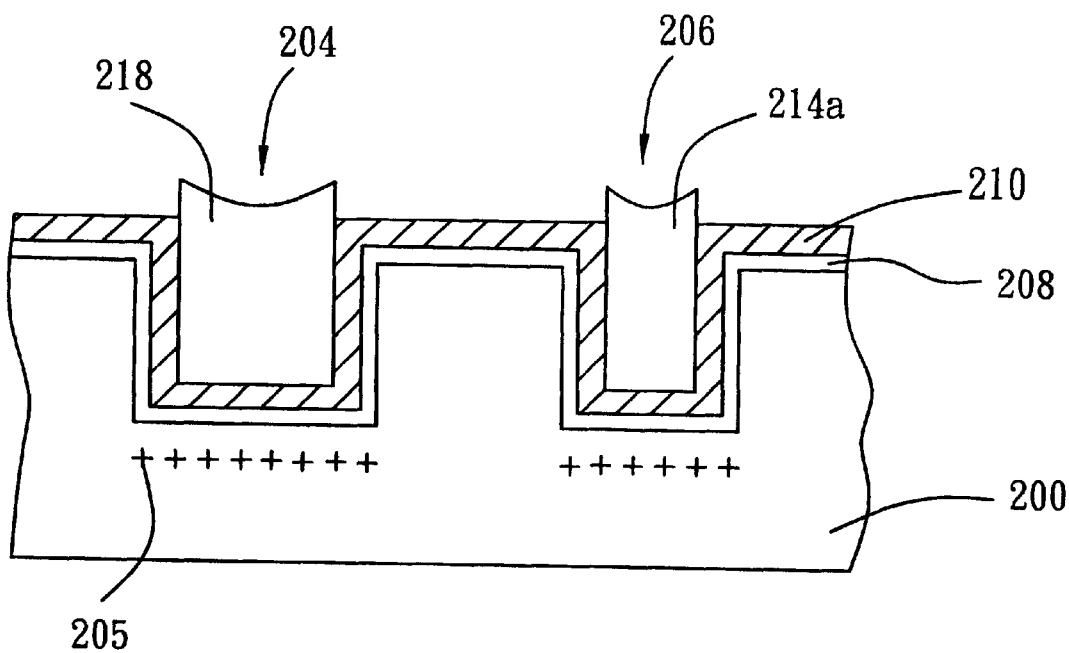
Figure 2F:
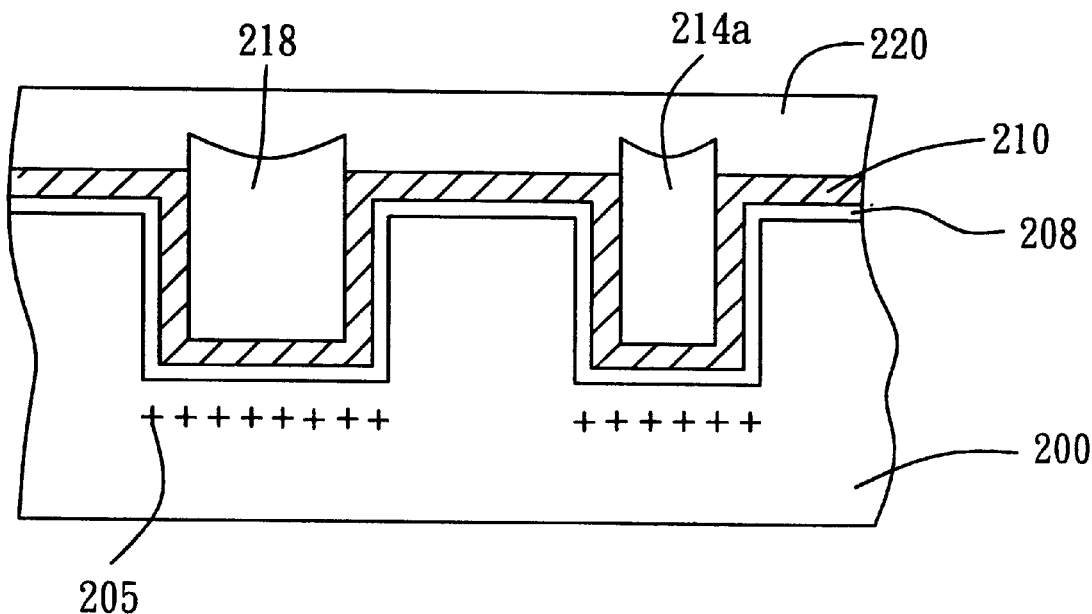
Figure 2G:
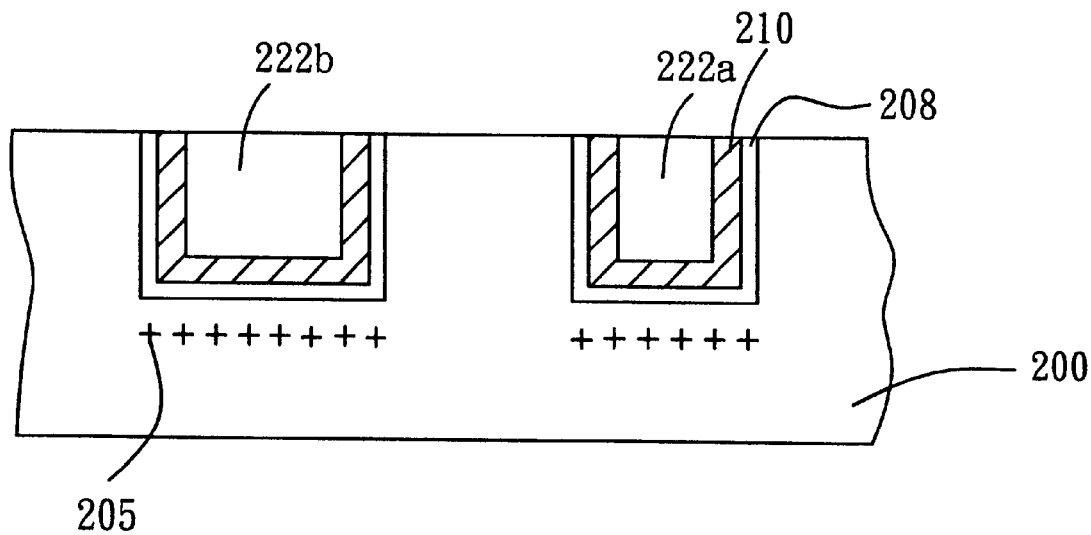
Figure 3:
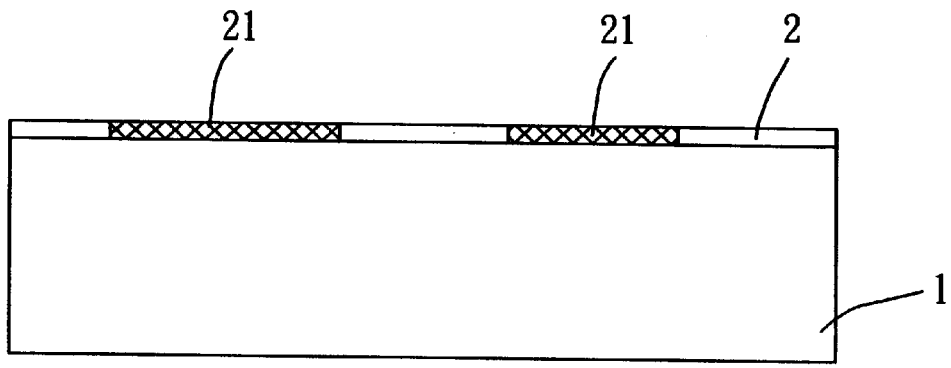
FIGS. 3~8 show schematically the process of the present invention in forming a dishing-free insulator in trench isolation.

Referring to FIG. 3, a semiconductor silicon substrate 1 is provided first, and then a photoresiost layer 2 with a trench pattern 21 thereon is formed on the silicon substrate 1 by a photolithography process.

Figure 4:
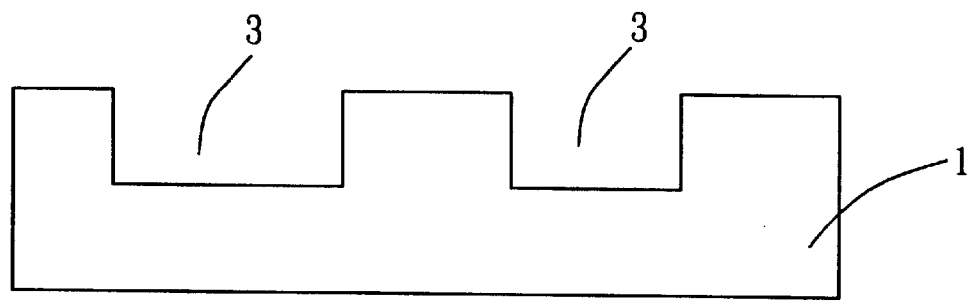

Referring to FIG. 4, by performing an anisotropic etching on the silicon substrate 1 according to the trench pattern 21 on the photoresist layer 2, related trenchs 3 having different widths are formed in the substrate 1. Then the photoresist layer 2 is removed.

Figure 5:
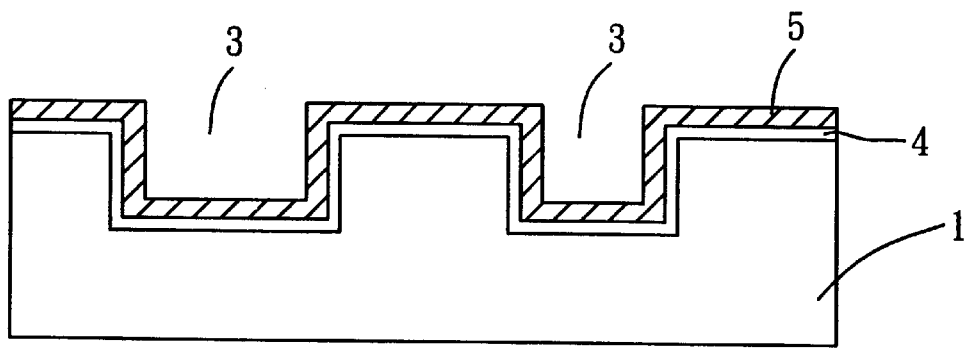

Referring to FIG. 5, a silicon dioxide layer 4 (pad oxide layer) of thickness 100~500 Å conforming the surface of the substrate 1 and the trenchs 3 is deposited, followed by depositing a silicon nitride layer 5 (oxidation-resistant layer) of thickness 300~800 Å conforming the surface of the silicon dioxide layer 4.

Figure 6:
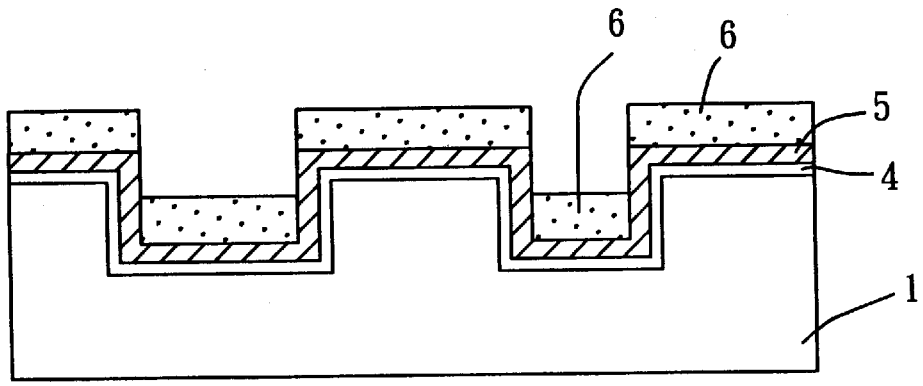

Referring to FIG. 6, by using Ion-Metal Plasma (IMP) process, a silicon film 6 (doped polysilicon, undoped polysilicon, or amorphous silicon) is deposited directionally with a height about half of the depth of the trench 3. Since the IMP process is a directional deposition process, there will be no silicon film to be deposited on the sidewall of the trench. The height of the silicon film 6 in the trenchs and outside the trenchs is the same. Even though the trench is very wide, the surface of the silicon film 6 in the trench is still flat without any concavity. The IMP process is to ionize a silicon material or a refractory-metal material to silicon ions or metal ions, and then using a biased voltage to deposit the silicon ions or metal ions directionally on the surface of the substrate.

Figure 7:
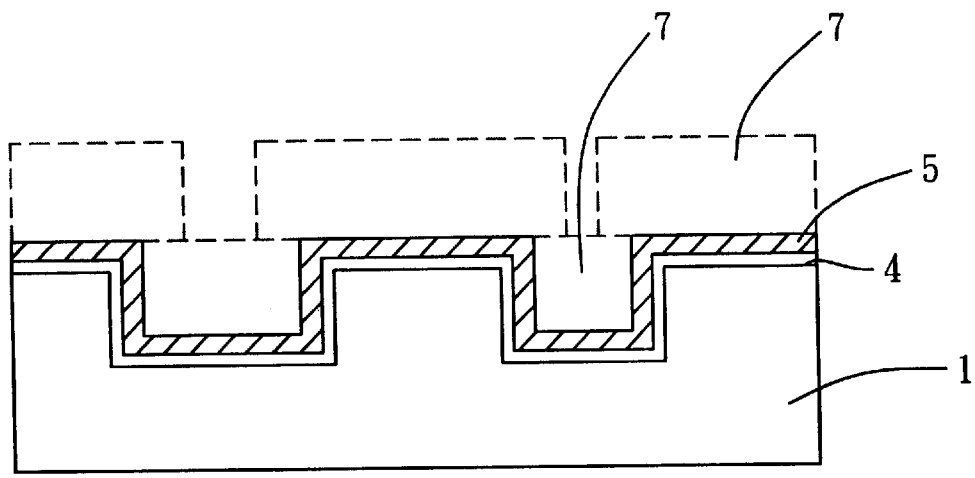

Referring to FIG. 7, by using a thermally oxidization process, the silicon film 6 will become a silicon-oxide layer 7. The silicon-oxide layer 7 in the trench 3 has a height the same as the depth of the trench 3.

Figure 8:
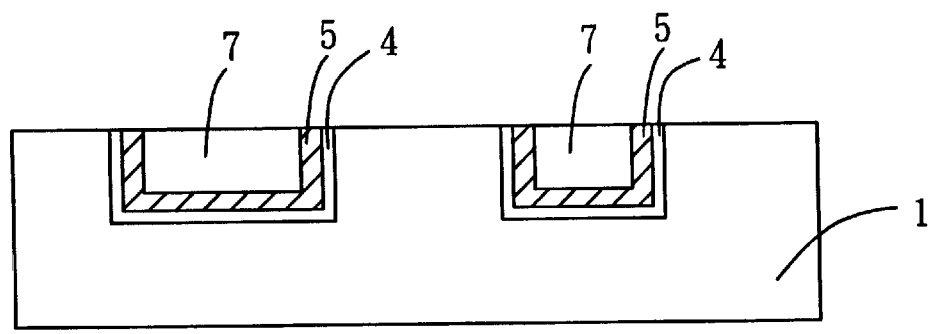

Referring to FIG. 8, removing the silicon-oxide layer 7, the silicon nitride layer 5 and the silicon dioxide layer 4 outside the trench 3 by a CMP process, a dishing-free insulator in trench isolation is formed. This is because that the surface of the silicon-oxide layer 7 is very flat without any concavity The scope of the present invention depends only upon the following Claims, and is not limited by the above embodiment.

What is claimed is:

1. A method of making dishing-free insulator in trench isolation, comprising the steps of:
   a. providing a semiconductor silicon substrate;
   b. forming a trench pattern on the silicon substrate,
   c. forming a first dielectric layer conforming the surface of the substrate having trenchs;
   d. depositing an oxidation-resistant layer conforming the surface of the first dielectric layer;
   e. depositing a silicon film directionally by using Ion-Metal Plasma (IMP) process;
   f. thermally oxidizng the silicon film to form a silicon-oxide layer;
   g. removing the silicon-oxide layer, the oxidation-resistant layer and the first dielectric layer outside the trench.

2. The method according to claim 1, wherein the first dielectric layer is a silicon dioxide layer.

3. The method according to claim 1, wherein the oxidation-resistant layer is a silicon nitride layer.

4. The method according to claim 1, wherein the silicon film is a material selected from the group consisting of doped polysilicon, undoped polysilicon and amorphous silicon.

5. The method according to claim 1, wherein a CMP process is used in step g.

* * * * *